United States Patent
Fuchs et al.

(10) Patent No.: US 8,836,145 B2
(45) Date of Patent: *Sep. 16, 2014

(54) POWER SEMICONDUCTOR DEVICE WITH REDUCED CONTACT RESISTANCE

(71) Applicant: International Rectifier Corporation, El Segundo, CA (US)

(72) Inventors: Sven Fuchs, Croydon (GB); Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/780,161

(22) Filed: Feb. 28, 2013

(65) Prior Publication Data

US 2013/0175690 A1    Jul. 11, 2013

Related U.S. Application Data

(63) Continuation of application No. 11/890,965, filed on Aug. 8, 2007, now Pat. No. 8,390,131, which is a continuation-in-part of application No. 11/144,483, filed on Jun. 2, 2005, now Pat. No. 7,678,680.

(60) Provisional application No. 60/821,831, filed on Aug. 9, 2006, provisional application No. 60/576,767, filed on Jun. 3, 2004.

(51) Int. Cl.
| | |
|---|---|
| H01L 23/48 | (2006.01) |
| H01L 23/52 | (2006.01) |
| H01L 29/40 | (2006.01) |
| H01L 23/498 | (2006.01) |
| H01L 23/00 | (2006.01) |
| H01L 23/31 | (2006.01) |

(52) U.S. Cl.
CPC ..... *H01L 23/498* (2013.01); *H01L 2924/01022* (2013.01); *H01L 2924/13055* (2013.01); *H01L 2224/49175* (2013.01); *H01L 2224/73153* (2013.01); *H01L 2924/01029* (2013.01); *H01L 24/32* (2013.01); *H01L 2924/01079* (2013.01); *H01L 24/14* (2013.01); *H01L 2924/01005* (2013.01); *H01L 2924/01082* (2013.01); *H01L 2924/0001* (2013.01); *H01L 24/13* (2013.01); *H01L 2924/01074* (2013.01); *H01L 2924/01023* (2013.01); *H01L 24/17* (2013.01); *H01L 2924/19043* (2013.01); *H01L 2924/01033* (2013.01); *H01L 2924/13091* (2013.01); *H01L 23/3107* (2013.01); *H01L 2924/1815* (2013.01); *H01L 2924/01073* (2013.01); *H01L 2224/48247* (2013.01); *H01L 2924/01327* (2013.01); *H01L 24/73* (2013.01); *H01L 2924/01088* (2013.01); *H01L 2224/16* (2013.01); *H01L 2924/01047* (2013.01); *H01L 2924/01075* (2013.01); *H01L 2224/13099* (2013.01); *H01L 2924/14* (2013.01); *H01L 24/05* (2013.01); *H01L 2924/01006* (2013.01); *H01L 2924/01013* (2013.01); *H01L 2924/014* (2013.01); *H01L 2224/32245* (2013.01); *H01L 2924/01078* (2013.01); *H01L 24/11* (2013.01)

USPC .......................................... 257/778; 257/780

(58) Field of Classification Search
USPC ............. 257/459, E23.015, E23.02, E23.037, 257/E23.04, E21.523, E21.59, 778, 341, 257/360, 401, 750, 751, E29.257

See application file for complete search history.

(56) References Cited

U.S. PATENT DOCUMENTS

| | | | |
|---|---|---|---|
| 3,965,567 A * | 6/1976 | Beerwerth et al. | 438/13 |
| 6,413,851 B1 * | 7/2002 | Chow et al. | 438/613 |

(Continued)

FOREIGN PATENT DOCUMENTS

| | | |
|---|---|---|
| JP | H 5-259167 | 10/1993 |
| JP | 2001-217275 | 8/2001 |

(Continued)

*Primary Examiner* — Colleen Matthews
*Assistant Examiner* — Quovaunda V Jefferson
(74) *Attorney, Agent, or Firm* — Farjami & Farjami LLP

(57) ABSTRACT

A semiconductor device that includes an electrode of one material and a conductive material of lower resistivity formed over the electrode and a process for fabricating the semiconductor device.

20 Claims, 16 Drawing Sheets

(56) References Cited

U.S. PATENT DOCUMENTS

2002/0036345 A1* 3/2002 Iseki et al. .................... 257/734
2002/0079459 A1* 6/2002 Dorscheid et al. ....... 250/370.11
2002/0167082 A1* 11/2002 Weber et al. ................. 257/696
2002/0185710 A1* 12/2002 Zandman et al. ............ 257/620

FOREIGN PATENT DOCUMENTS

| | | |
|---|---|---|
| JP | 2003-45877 | 2/2003 |
| JP | 2004-500720 | 1/2004 |
| JP | 2004-47622 | 2/2004 |

* cited by examiner

POWER SEMICONDUCTOR DEVICE WITH REDUCED CONTACT RESISTANCE

This is a continuation of application Ser. No. 11/890,965 filed Aug. 8, 2007.

RELATED APPLICATION

This application is a continuation-in-part of U.S. application Ser. No. 11/144,483, filed Jun. 2, 2005, entitled Semiconductor Device With Reduced Contact Resistance which claims the benefit of U.S. Provisional Application No. 60/576,767, filed on Jun. 3, 2004, entitled Semiconductor Die Contact with Reduced Resistance, to which a claim of priority is hereby made and the disclosure of which is incorporated by reference. This application is also based on and claims benefit of U.S. Provisional Application No. 60/821,831, filed on Aug. 9, 2006, entitled Double Sided Copper Plating On Die to which a claim of priority is hereby made and the disclosure of which is incorporated by reference.

BACKGROUND OF THE INVENTION

Recent advances in silicon cell technologies have reduced the RA of for example, a 30V device from 50 to 14 mOhm-mm$^2$. Advances in semiconductor device technology are likely to continue to reduce the RA. If this trend continues an active area of approximately 10 mm$^2$ can be expected to have an $R_{dson}$ of 630 μOhm to 240 μOhm depending on the fabrication process.

If semiconductor device technologies are able to meet these target specifications packaging technologies will have to improve significantly. The introduction of DirectFET® technology has enabled significant reductions in die free package resistance compared to conventional 8 lead SOIC power packages. A DirectFET® package (sold by the assignee of the present application), in simple terms, is a semiconductor package which includes a conductive can, and a semiconductor die disposed inside the can and electrically and mechanically connected to an interior surface of the can. U.S. Pat. No. 6,624,522 shows an example of such a package. Using the packaging concept embodied in a DirectFET® package, package resistance, excluding top metal resistance (the resistance associated with the power electrode, e.g. source electrode, of the semiconductor die which is directly connected by solder, conductive epoxy or the like to a conductive pad of a substrate such as a circuit board) is now sub 100 μOhm. However, when one considers the top metal resistance this is increased somewhat to between 0.2 and 0.7 mOhm depending on the model used. For example, through modeling it has been found that the top metallization can include current paths with up to 0.66 mOhm resistance. It is, therefore, desirable to reduce the resistance of the top metal of the semiconductor die in order to improve the overall resistance of a package such as a DirectFET® package.

SUMMARY OF THE INVENTION

According to one aspect of the present invention, the electrical resistance of a power electrode of a semiconductor device is reduced by forming a thick, and highly conductive metal such as copper to the top metal. Thus, a device according to the present invention includes a semiconductor die, having an electrode on a surface thereof, the electrode electrically and mechanically connected to the die being comprised of a first conductive material, and a conductive body, the conductive body being comprised of a second material having a resistivity that is lower than that of first conductive material.

In one embodiment, a barrier layer may be interposed between the conductive body and the electrode.

In another embodiment, the back electrode may also a conductive material of lower resistivity.

In yet another embodiment, a stress balancing metallic body may be applied to balance the stress on the die.

Other features and advantages of the present invention will become apparent from the following description of the invention which refers to the accompanying drawings.

DETAILED DESCRIPTION OF THE FIGURES

Figure 1:
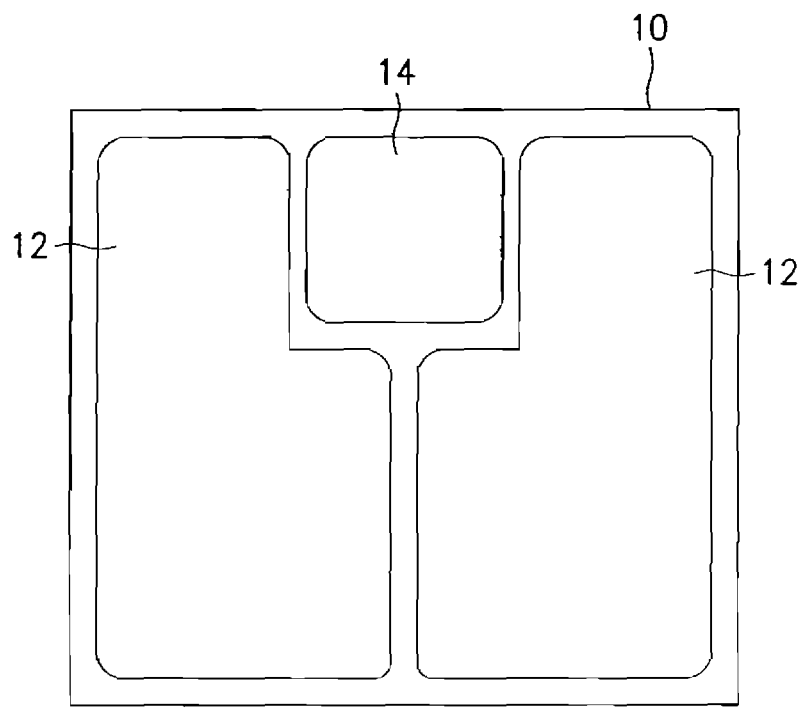
FIG. 1 illustrates a top plan view of a semiconductor die according to the prior art.

Referring to FIG. 1, a semiconductor device, such as a power MOSFET, according to the prior art includes a semiconductor body 10, at least one power electrode 12 (i.e. source electrode), and a control electrode (i.e. gate electrode) 14. The device shown in FIG. 1 is a vertical conduction type power device, and includes a second power electrode (i.e. drain electrode) (not shown) on a surface of semiconductor body 10 opposite first power electrodes 12.

The electrodes of a power device are made usually from Al, AlSi, or AlSiCu.

Figure 2:
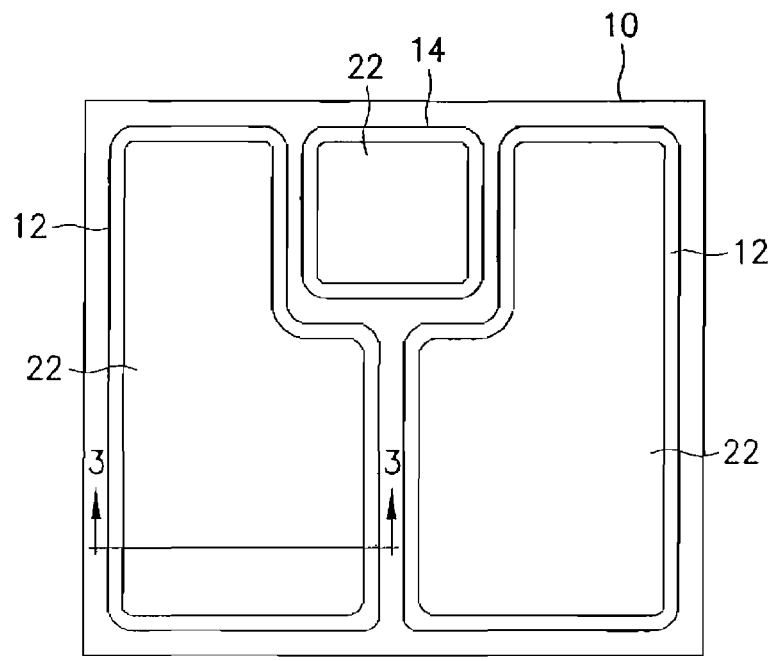
FIG. 2 shows a top plan view of a semiconductor device according to the present invention.
Figure 3:
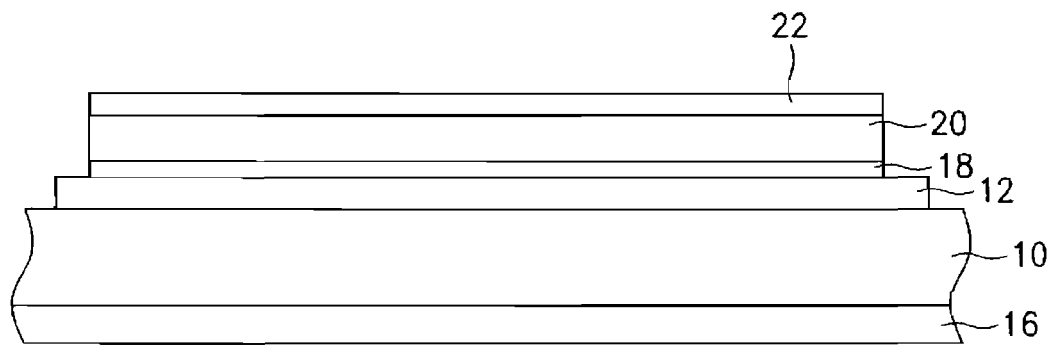
FIG. 3 shows a cross-sectional view of a semiconductor device according to the present invention along line 3-3 and viewed in the direction of the arrows.

Referring next to FIGS. 2 and 3, a semiconductor device according to the present invention includes semiconductor body 10, at least one first power electrode 12, and a control electrode 14. Referring specifically to FIG. 3, a device according to the present invention preferably includes second power electrode 16 disposed opposite on semiconductor body opposite power electrode 12. A semiconductor device according to the preferred embodiment of the present invention is a vertical conduction type power MOSFET in which first power electrode 12 is the source electrode, the second power electrode 16 is the drain electrode and control electrode 14 is the gate electrode. It should be noted that although FIG. 2 shows two first power electrodes 12, the present invention does not require two first power electrodes. Furthermore, it should be noted that although the preferred embodiment is a power MOSFET, the present invention is fully applicable to other power semiconductor devices including IGBTs, power diode, triacs, and power bipolar transistors, and the like.

Referring now specifically to FIG. 3, a semiconductor device according to the preferred embodiment of the present invention includes barrier layer 18 which is disposed on and electrically connected to a first power electrode 12, and conductive body 20 which is disposed on and electrically connected to barrier layer 18. Conductive body 20 is preferably made from copper, but can be made from any material of lower resistivity than that of first power electrode 12. Barrier layer 18 is preferably formed from titanium (Ti) and functions to a) to hinder and prevent contamination of first power electrode 12 by copper through diffusion, and b) ensure good adhesion of copper body 20 to first power electrode 12. In the preferred embodiment of the present invention titanium barrier layer 18 is about 20 nanometers thick. The thickness of copper body 20 can be selected to attain the desired resistivity, and is preferably between 10 µm to 20 µm. It is believed, however, that in a process according to the present invention it may be possible to achieve copper bodies 20 of as thick as 100 µm and possibly thicker. It also should be noted that barrier layer 18 can be eliminated if conductive body 20 is made from such a material that a) adheres well to first power electrode 12, and b) does not diffuse into first power electrode 12, or otherwise harms the functionality of the semiconductor die.

A device according to the present invention is preferably configured for flip-chip-type mounting. Specifically, copper body 20 on each electrode is provided with solderable body 22 which enables copper body 20 to become electrically and mechanically connectable to a conductive pad directly by a conductive adhesive such as solder, or a conductive epoxy, such as silver loaded epoxy.

Examples of suitable solderable bodies 22 include a nickel (e.g. 1-6 microns thick, specifically, for example, about two microns thick) layer over copper body 20 and a lead tin layer (e.g. about one micron thick) formed over the nickel layer, a bimetal stack such as NiAg, or NiAu. The Au may be deposited using a flash or immersion process.

It should be noted that in the preferred embodiment both first power electrodes 12 and control electrode 14 include barrier layer 18, a copper body 20 and optionally a solderable body 22 to facilitate flip-chip mounting.

Figure 4:
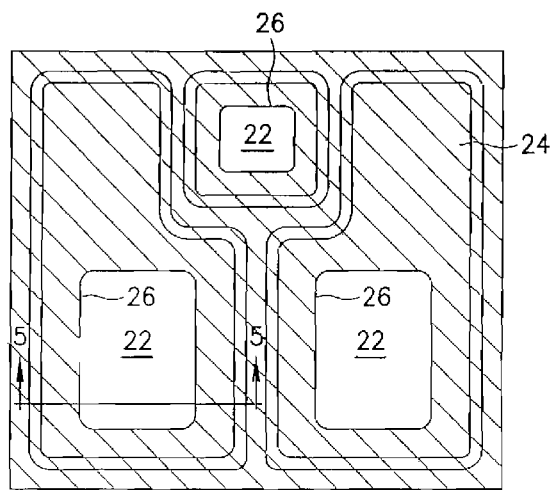
FIG. 4 shows a top plan view of a semiconductor device according to the present invention having a passivation layer formed thereon.
Figure 5:
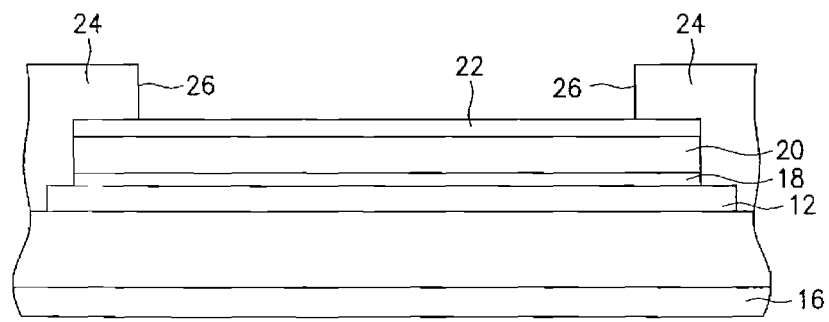
FIG. 5 shows a cross-sectional view of the device shown in FIG. 4 along line 5-5 and viewed in the direction of the arrows FIG. 6 show a top perspective view of a package which includes a semiconductor device according to the present invention.

Referring next to FIGS. 4 and 5, a device according to the present invention may include a passivation body 24 (illustrated by slanted lines in FIG. 4). Passivation body 24 includes at least one opening 26 to expose a respective solderable body 22 whereby a conductive adhesive can reach the exposed solderable body at the bottom of each opening in passivation body 24.

Passivation body 24 is preferably composed of a suitable epoxy, polyimide, BCB (benzocyclobutene), or other organic material that can also function as a solder resist. As a result, solder or any other conductive adhesive is prevented from traveling and shorting a first power electrode 12 to control electrode 14 when the device is flip-chip mounted.

Figure 6:
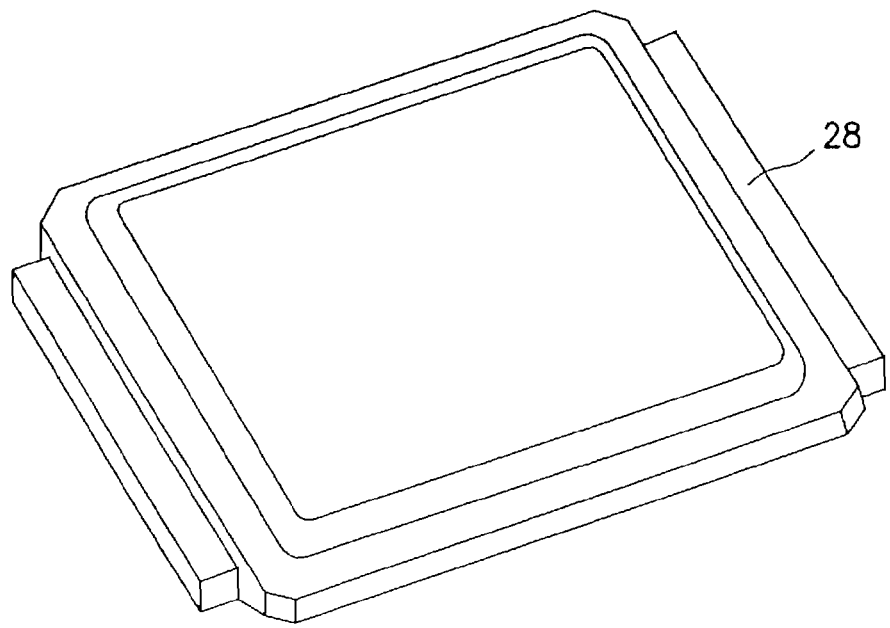
Figure 7:
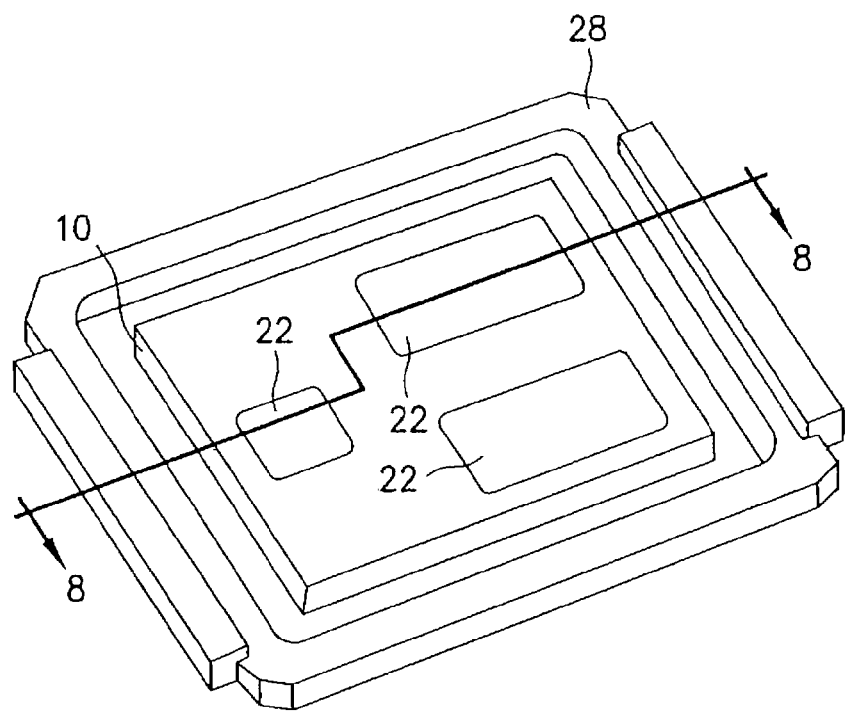
FIG. 7 shows a bottom perspective view of a package which includes a semiconductor device according to the present invention.
Figure 8:
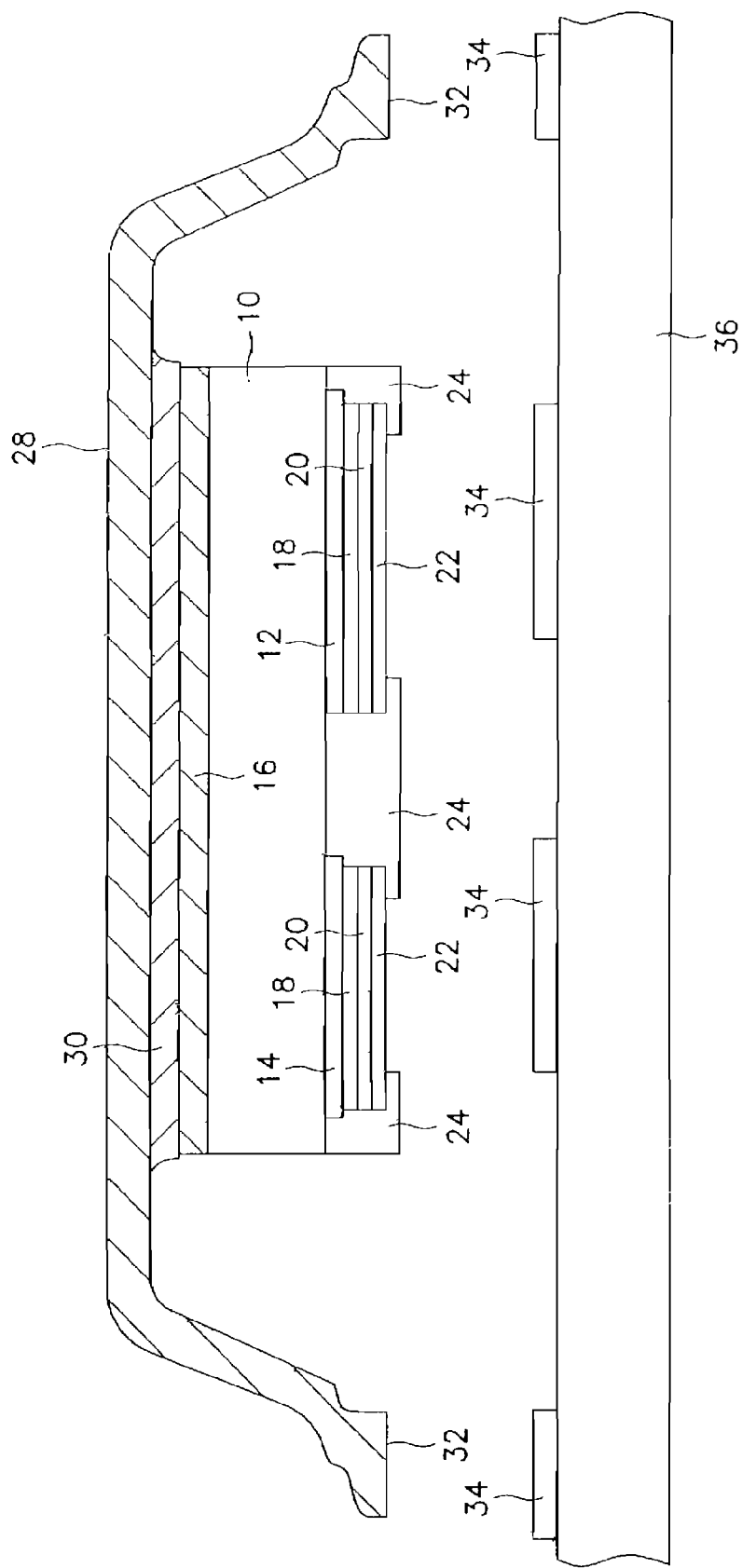
FIG. 8 illustrates a cross-sectional view of the package shown in FIG. 7 along line 8-8 and viewed in the direction of the arrows.

Referring next to FIGS. 6, 7 and 8, a device according to the present invention can be disposed within a conductive can 28 or some other conductive clip according to the concepts disclosed in U.S. Pat. No. 6,624,522, which is assigned to the assignee of the present invention, and the disclosure of which is incorporated by reference.

Referring specifically to FIG. 8, second power electrode 16 is electrically and mechanically attached to an interior surface of can 28 by a layer of conductive adhesive 30 such as solder or conductive epoxy. Thus, conductive can 28, which is preferably formed from copper or a copper alloy, can serve as an electrical connector for second power electrode 16. Specifically, can 28 includes connection surfaces 32 each for external electrical connection (by a conductive adhesive such as solder, or conductive epoxy) to a respective conductive pad 34 on a substrate 36, such as a circuit board. In addition, control electrode 14 and each first power electrodes 12 (only one illustrated for clarity) is available for direct electrical connection to a respective conductive pad 34 by a conductive adhesive such as solder or conductive epoxy in that each includes a solderable body 22 disposed thereover.

Alternatively, second power electrode 16 of a device according to the present invention can be electrically and mechanically attached by a conductive adhesive such as solder or conductive epoxy to the conductive pad of a lead frame or a substrate such as a circuit board.

A device according to the present invention is fabricated according to a method described hereafter.

Figure 9:
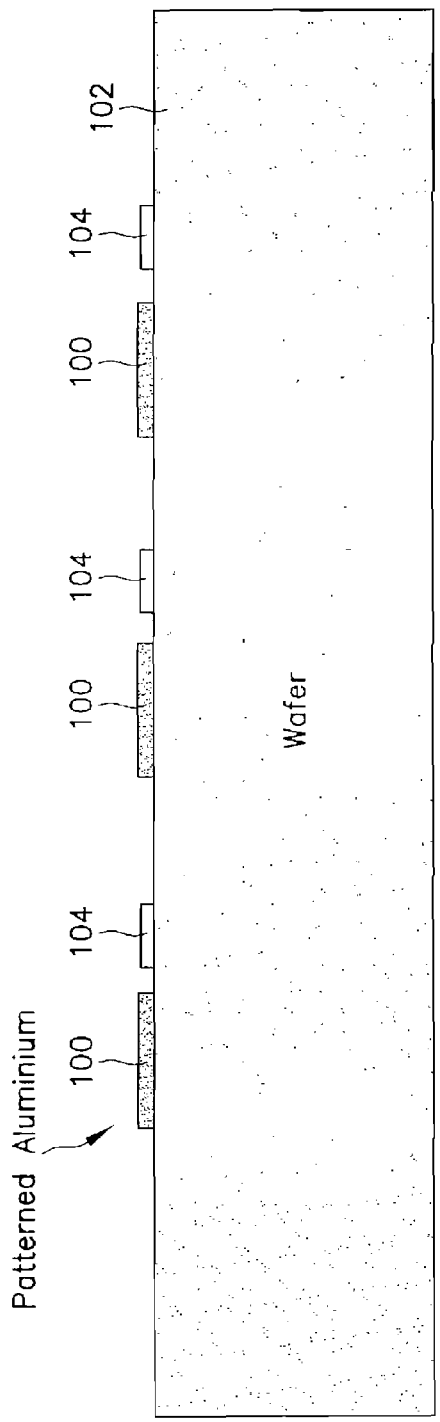
FIGS. 9-17 illustrate the steps in the fabrication of a semiconductor device according to an embodiment of the present invention.

Referring first to FIG. 9, a semiconductor wafer 102 is prepared to have a plurality of semiconductor die each having at least one power electrode 100. Power electrode 100 may be first power electrode 12 as seen in the preferred embodiment. Also, each die may include a control electrode 104, such as control electrode 14 as described above, which is processed simultaneously with the power electrode 100.

Figure 10:
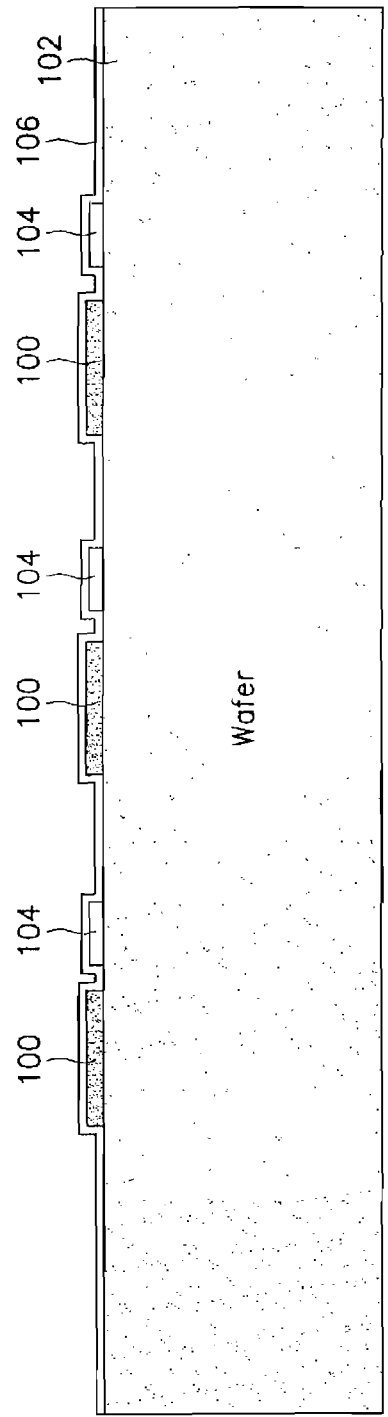

Referring next to FIG. 10, a blanket barrier layer 106 is formed over one face of wafer 102 covering electrodes 100, 104 as well as areas of wafer 102 between the electrodes. Barrier layer 106 is preferably formed from titanium and may be about 20 nanometers thick. Titanium may be sputtered.

Other suitable materials for forming blanket barrier layer 106 include tantalum or titanium tungsten.

Figure 11:
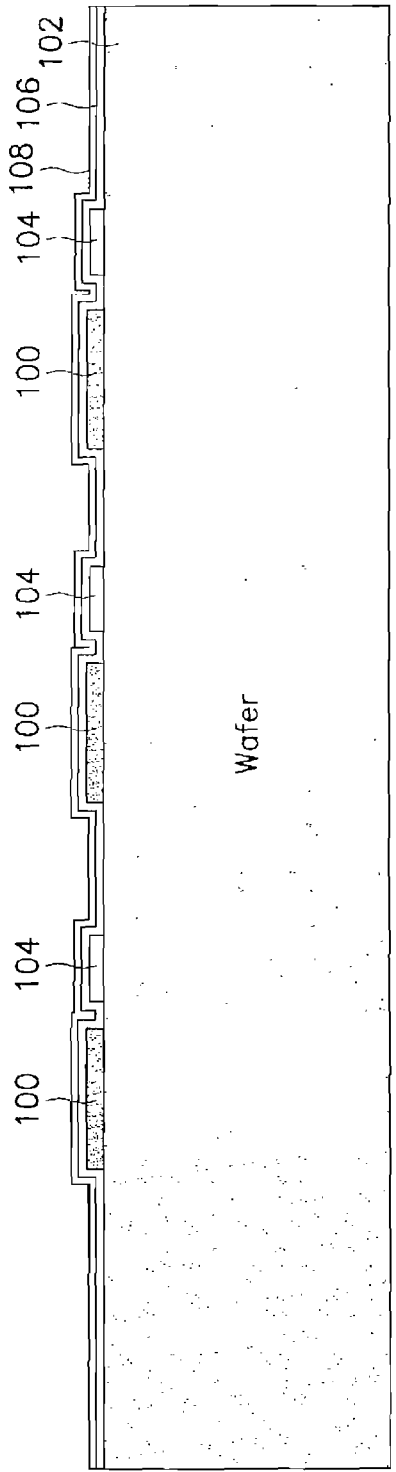

Thereafter, a blanket copper seed layer 108 is formed on barrier layer 106, as seen in FIG. 11. Blanket copper seed layer 108 may be about 200 nanometers thick and may be sputtered on as well. Alternatively, blanket copper seed layer 108 may be plated through electroless plating. Blanket copper seed layer 108 forms a low resistance path for the plating current and acts as a plating electrode.

Figure 12:
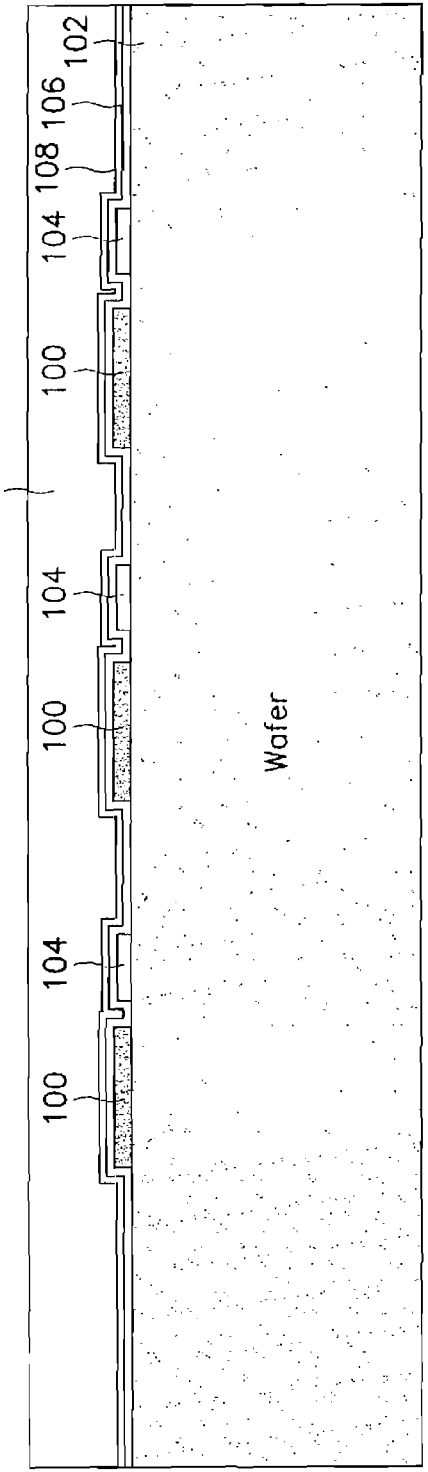
Figure 13:
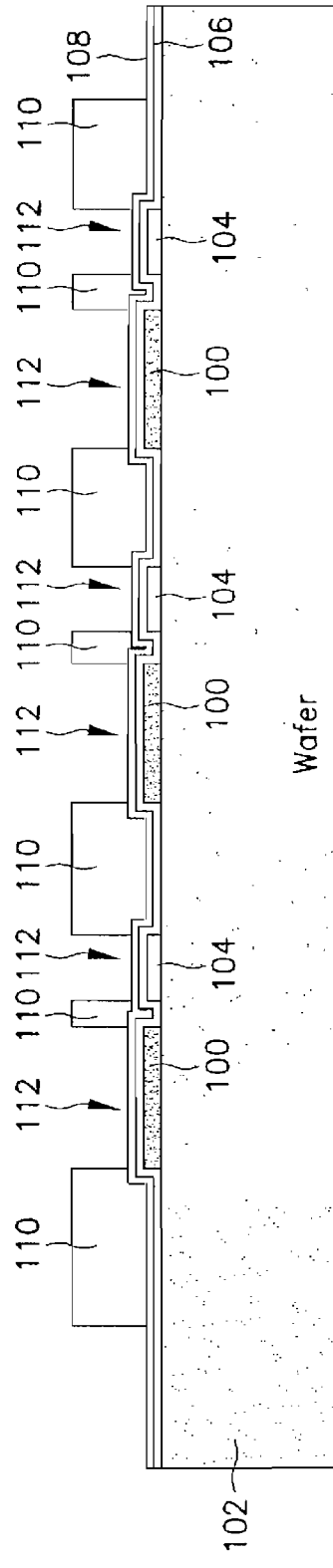

Next, photoresist layer 110 is formed over blanket copper seed layer 108, as seen in FIG. 12. In one embodiment a shipley BPR 100 liquid photoresist was used to form photoresist layer 110. This material is available from Rohm and Haas electronic materials, Marlborough, Mass., and was selected as it is capable of forming a layer of up to 100 μm in a single application. Photoresist layer 110 is then patterned through conventional photolithography to include openings 112 each exposing a portion of blanket copper seed layer 108 over each electrode 100, or 104 as seen in FIG. 13.

The photoresist deposition, edge bead removal, and pre-cure can be completed on a spin coater track system. The photoresist is then exposed in a mask aligner or similar photo tool. The exposed photoresist material is then developed in a suitable developer solution. If required, a post develop bake stage at elevated temperatures may be performed. The following is an example of a process for applying a photoresist:
1. Pre-clean: Iso-propyl Alcohol (IpA) 30 seconds at 50 rpm followed by nitrogen 2 min at 500 rpm.
2. Dispense: 5.5 ml of BPR 100 dispensed within 20 seconds on a wafer spinning at 50 rpm.
3. Spread cycle: ramp to 500 rpm at 100 rpm/sec acceleration, followed by 10 sec spin.
4. Spin cycle: ramp to 1000 rpm (100 rpm/sec acceleration) followed by 30 sec spin.
5. Dry cycle: 30 sec at 300 rpm.
6. Edge Bead Removal: IPA to remove photoresist from 2 mm perimeter.
7. Soft Bake: 3 min 65° C. in a convection oven ramped up to 90° C. to cure for 30 minutes.
8. Exposure: coated wafers were exposed to UV light at 5 mJ for 3 minutes.
9. Post bake: 10 minutes at 110° C.
10. Development: photoresist was developed using BPR developer; bath was made up of 96% v/v deionized water and 4% v/v developer.
11. Final rinse and dry: with deionized water followed by nitrogen on the spin coater.

During photoresist developing residual photoresist material may remain in opened apertures. In order to enable uniform plating into these apertures the residual resist should be removed. This is done preferably using an oxygen plasma clean process (wafers are bombarded with $O_2$).

Figure 14:
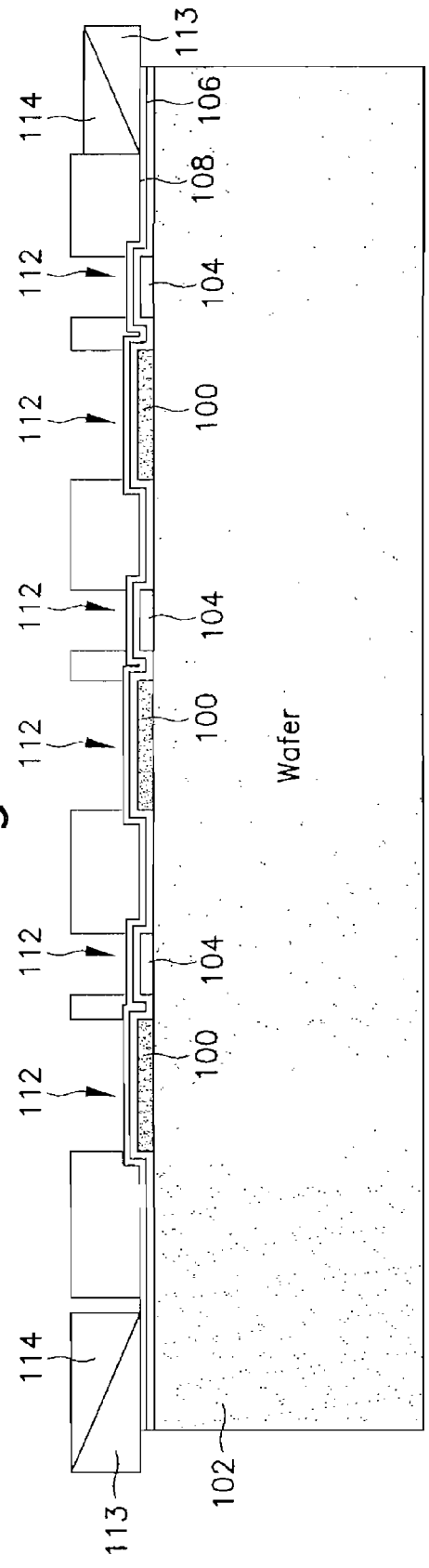

Thereafter, as illustrated by FIG. 14, an electrical contact 113 and seal clamp 114 is applied to the edges of wafer 102. Electrical contact 113 and seal clamp 114 is provided to apply voltage to electrodes 100, 104 in order to facilitate the electroplating process, as will be described later.

Figure 15:
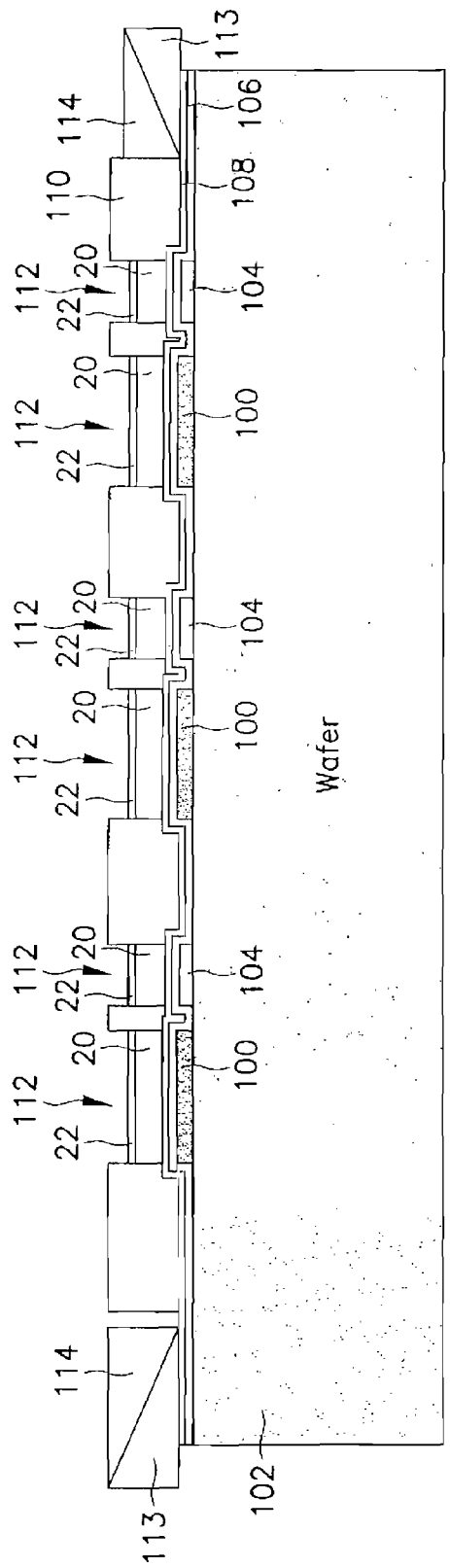

Next, wafer 102 is immersed in an electroplating solution, and the appropriate voltage is applied to electrical contact 113 whereby a copper body 20 is grown in each opening 112 on exposed copper seed layer 108. Also, a solderable body 22 is formed over each respective copper body 20 as seen in FIG. 15.

For example, the following procedure can be followed to carry out the electroplating step:
1. Put wafer on a chuck. The chuck is a mechanical fixture which also provides electrical contact.
2. Leak test to assure tight seal.
3. Wet wafer.
4. Remove oxide layer on copper with 10% Sulphuric acid.
5. Rinse with deionized water.
6. Dry with nitrogen.
7. Copper plate in a commercial copper plating solution. The solution may be agitated. In certain systems the wafer is rotated to aid deposition.
8. Rinse with deionized water.
9. Dry with nitrogen.
10. Nickel plate in a commercial nickel plating solution.
11. Rinse with deionized water.
12. Dry with nitrogen.
13. SnPb plate in commercial plating bath.
14. Rinse with deionized water.
15. Dry with nitrogen.

In a typical electroplating process, the surface to be electroplated forms the cathode and is submerged in a plating solution. Each manufacturer may offer its own plating solution. Manufacturers of these materials include Atotech, MacDermid, Rohm and Hass, and Cookson Electronics. The plating solution may be any one of the following:
1. Alkaline—several modifications of cyanide and non-cyanide.
2. Mildly alkaline—pyro phosphate
3. Acid—sulfate and fluorobate.

More typically the plating solution is acid based. An example of such a plating solution may include the following chemicals:
1. $H_2SO_4$ contributes to the overall solution conductivity, reduced anode and cathode polarization (e.g. 60 g/ltr).
2. $CuSO_4$ medium for plating (e.g. 200 g/ltr).
3. HCL, which helps to corrode anode (e.g. ppm level).
4. Brightener/Grain refiner.
5. Carrier/polarizer, which helps with crystal deposition and organization.
6. Leveller, which helps with crystal deposition and organization.

The last three ingredients are typically organic materials. During the plating the following chemical reactions occur at each electrode:

At Anode (+Ve charged): Oxidation of the copper
$Cu \rightarrow Cu^{2+} + 2e^-$

At Cathode/Wafer (−Ve charged): Reduction of Copper
$Cu^{2+} + 2e^- \rightarrow Cu$ As a rule of thumb and from Faradays laws 2×96,485 coulombs of charge are usually required to produce one mole of copper from copper (II) ion ($Cu^{2+}$). The rate of plating is determined by the current applied to the electrodes and can be determined using the relationship Q=current (I)×time (t) in conjunction with Faradays law.

Figure 16:
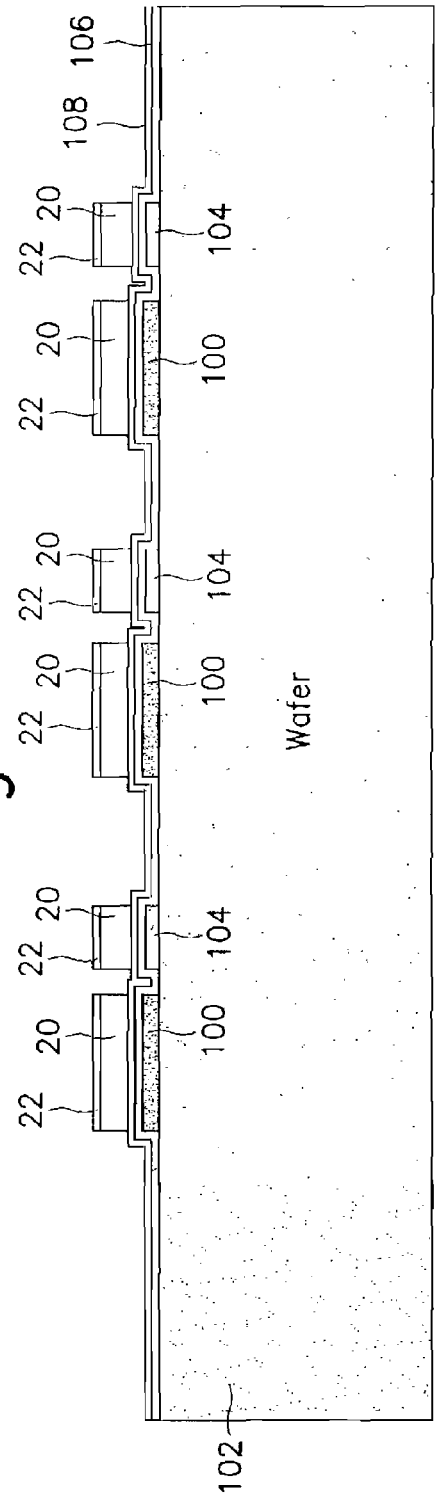
Figure 17:
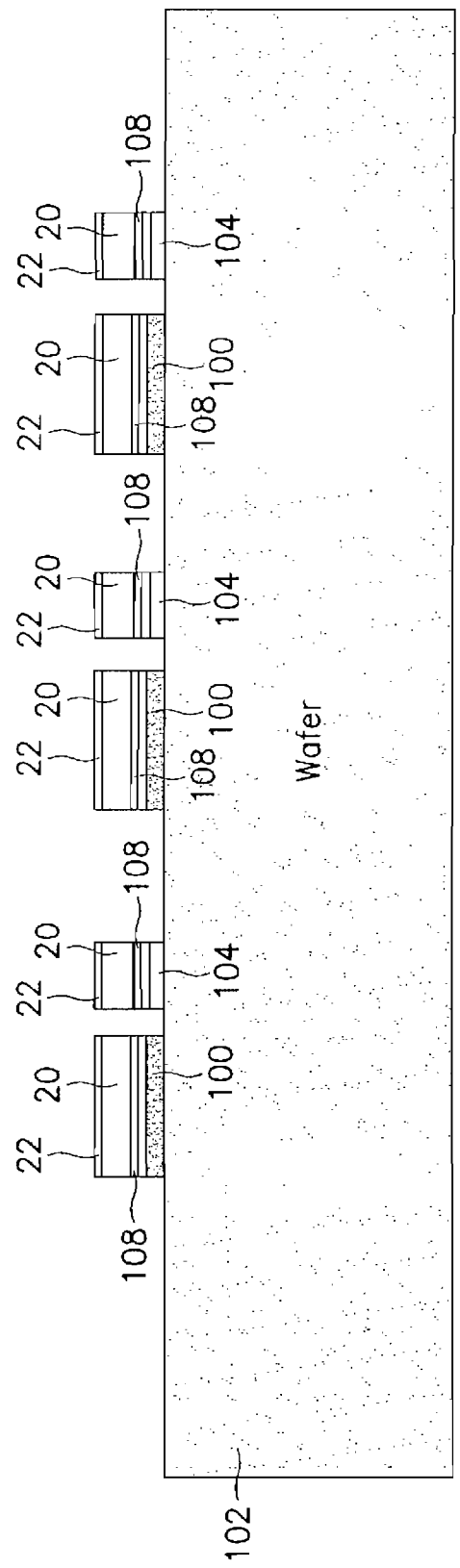

Next, the remaining photoresist 110 is removed as seen in FIG. 16. Thereafter, any copper seed material 108 and barrier material 106 that is not under copper bodies 20 is removed to obtain the structure shown in FIG. 17.

For example, the following procedure can be carried out:
1. Strip the remaining photoresist with stripper with BPR Stripper
2. Etch copper with a copper etchant. Both alkaline and acid chemistries are suitable for etching copper. Two of the most common etchant chemistries are ammoniacal etchant and cupric chloride etchant.
3. Rinse with deionized water.
4. Dry with nitrogen.
5. Etch titanium with titanium etchant, for example, Hydrogen Peroxide or dilute Hydrofluoric acid.
6. Rinse with deionized water.

7. Dry with nitrogen.
8. Take the wafer out of the chuck.

The wafer can then be processed according to any known method to obtain a device according to the present invention. For example, back metal is applied to form second power electrode, and passivation 24 is applied and patterned to obtain a plurality of devices as described above.

For example, the wafer can be passivated through a screen printing process. The passivation material is preferably an aqueous developing, liquid photoimagable polymer. The following is an example of a procedure that can be followed in applying the passivation:

1. Mix the passivation material: 100 parts paste part to 19 parts hardener by weight.
2. Screen print the mixture.
3. Tack dry in convection oven at 80° C. for 20 minutes.
4. Expose the passivation for 25 seconds at 5 mJ.
5. Develop the passivation.
6. Apply final cure for 60 minutes at 150° C. in a convection oven.

It should be noted that in some cases the wafer may become warped. This is due to high stresses caused by the recrystallization of the fine grain structure of the electroplated copper.

Thereafter, wafer 102 is diced to obtain individual semiconductor devices according to the present invention, which can be ready to be received in a conductive can 28 as described above, or packaged in any other package for example an SO8, TO-220, D2pak, Dpak and MLP packages.

To perform the dicing step it may be preferable to use a dual step cutting process. The first cut should be performed with a blade specially designed for copper dicing, followed by a standard blade suitable for cutting a semiconductor die at a standard speed. Although the wafer can be fabricated without any copper in the wafer streets, copper dicing may be necessary to penetrate the residual copper present on the perimeter of the wafer contact ring. The copper deposition can be avoided by correctly designing the perimeter plating contact to fit within the plating chuck seal, thereby eliminating the copper dicing step. The re-design may also help to reduce wafer warpage, as the plated copper on the contact ring can be one of the main contributors to the stress within the wafer.

Figure 18:
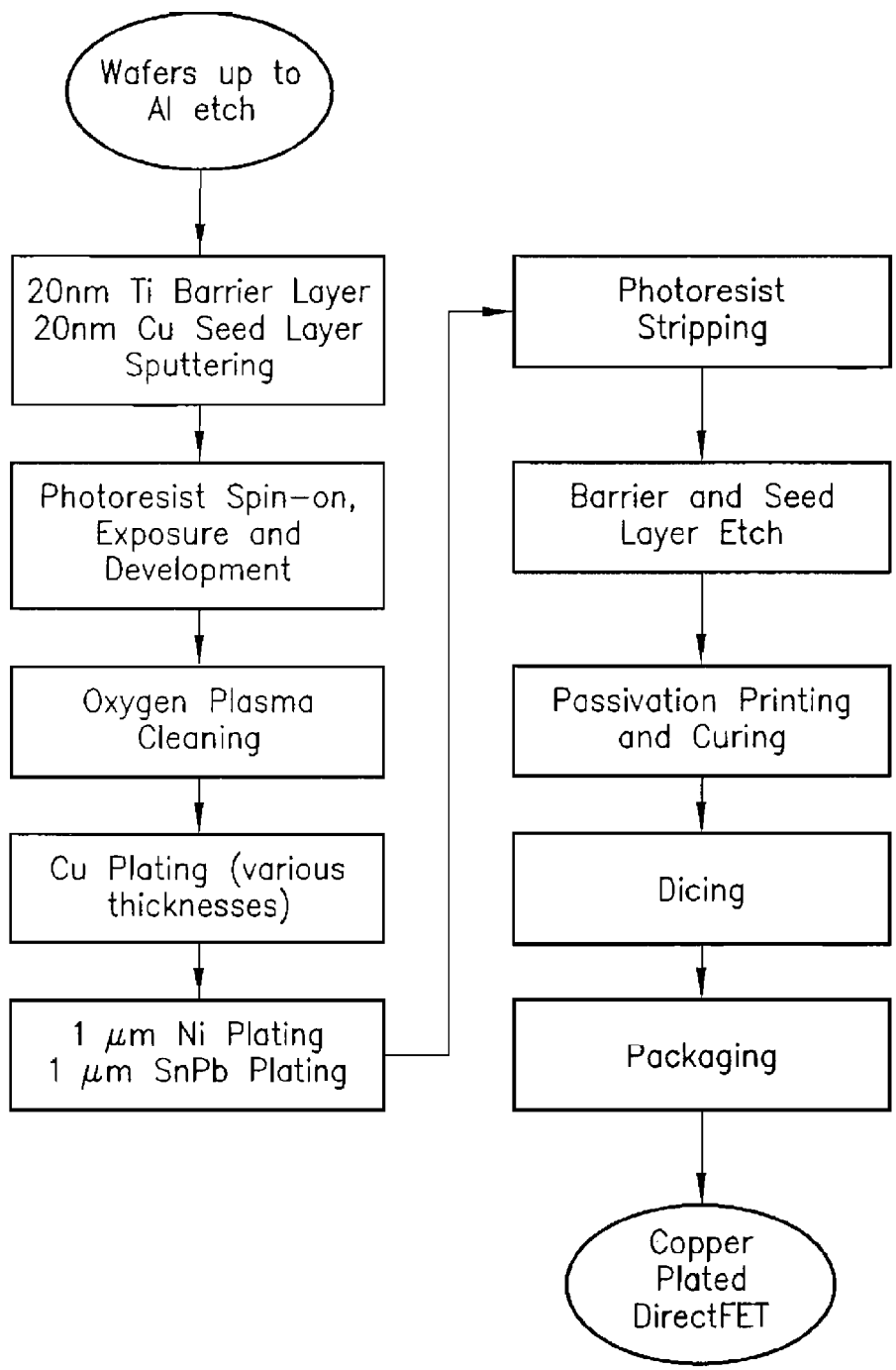
FIG. 18 shows a summary of a process for fabricating a device according to an embodiment of the present invention.

FIG. 18 summarizes a process for fabricating a semiconductor device according to the present invention.

It should be noted that any material left from copper seed layer merges with the electroplated copper bodies 20. Thus, a device according to the preferred embodiment of the present invention will include a copper body 20 formed over a barrier layer 18.

Alternatively, copper bodies may be applied to a MOSFET die using a process of seed layer deposition, electroplating, photoresist, copper etch/strip or alternatively by pattern plating. In the alternative process, the photoresist is applied after electroplating. However, applying photoresist prior to electroplating is preferred in that only minimal copper etching is required and tighter tolerances are often achievable on the thick copper films.

The metal finish required on the top surface of the copper is determined by the required interconnection between the die and the package or the die and the circuit board. For solderable contacts to a copper surface a Nickel barrier is typically required followed by a thin gold film. The nickel acts as a solderable layer and acts to prevent solder forming intermetallics with the underlying copper. The gold layer prevents oxidation of the nickel and is consumed during the soldering process. Typical recommended nickel thickness is in the range of 1 to 8 μm, or preferably 4 to 8 μm.

It should also be noted that a copper body 20 need not cover the entire surface of the electrode over which it resides. Rather, the device covered by a copper body can be varied to obtain the desired reduction in the resistivity for the device.

Figure 20A:
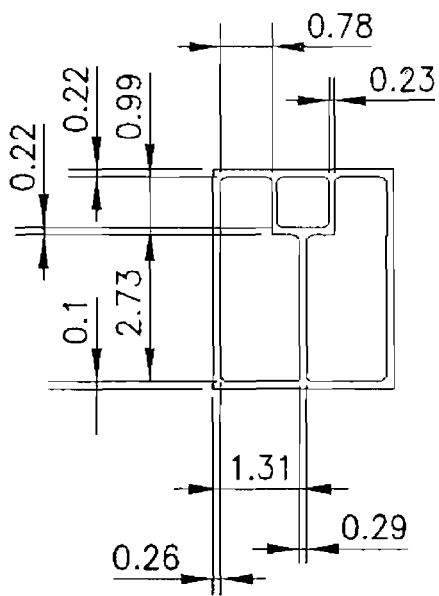
FIG. 20A illustrates the top plan view of an example of the present invention, in which the conductive body having the lower resistivity covers the entire surface of the electrodes of a semiconductor device.
Figure 20B:
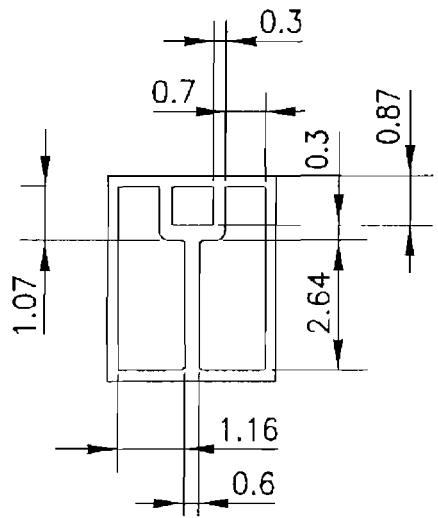
FIG. 20B illustrates the top plan view of an example of the present invention, in which the conductive body having the lower resistivity covers not all but a substantial portion of the electrodes of a semiconductor device.
Figure 20C:
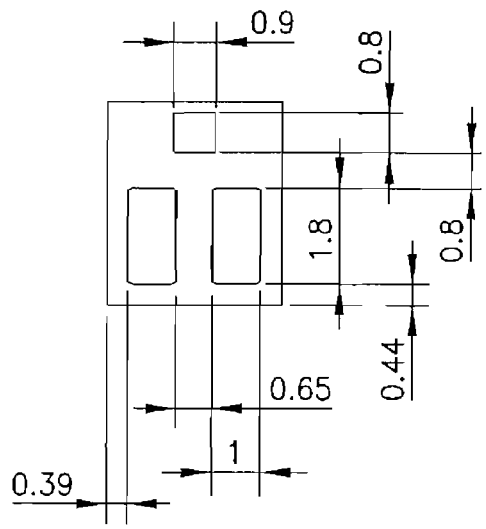
FIG. 20C illustrates the top plan view of an example of the present invention, in which the conductive body having the lower resistivity covers not all but a lesser portion (less than that shown by FIG. 20B) of the entire surface of the electrodes of a semiconductor device.

Referring for example to FIGS. 20A-20C which show respectively a first pattern, a second pattern, and a third pattern, for copper bodies 20, it has been observed through experimentation that pattern variation may affect the resistivity obtained.

Relatively simple models based upon using the relationship $R=\rho L/A$ show that top metal resistance can add significant resistance to current flowing along the top surface of a die. In practice these models are flawed in that they only consider current flowing in one direction and do not include the parallel current paths that surround the device source pads connected to a circuit board. In order to obtain more accurate estimates of the benefits of adding thick copper to the power electrode of a die, finite element analysis (FEA) was performed. As is well known, the finite element method operates on the theory that any continuous function over a global domain can be approximated by a series of functions operating over a finite number of small sub-domains. ANSYS, available from ANSYS, Inc., Canonsburg, Pa., is a software which can be used for performing final element analyses. ANSYS solid models were set up and refined to include contributions from die, substrate, die attach adhesive and the copper can. Using this model as a baseline a copper layer was added to the model. The thickness of this layer was then modified to investigate the effect of metal thickness upon device $R_{dson}$.

FEA models of devices with thick copper showed less voltage dropped across the source region compared to devices with Aluminum front metal only.

Figure 19:
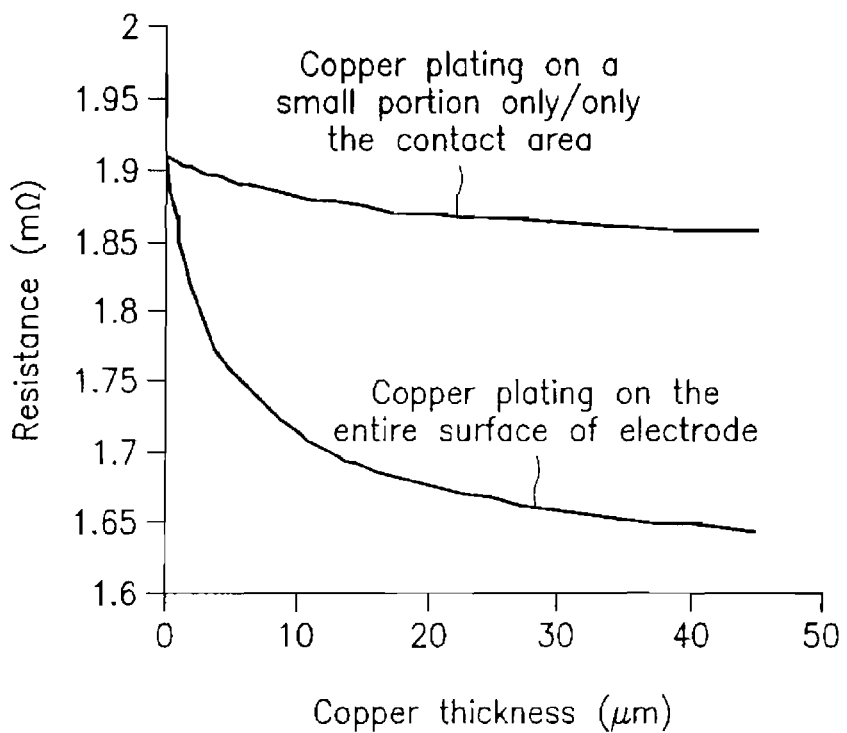
FIG. 19 shows the effect of the thickness of a conductive body on the lowering of the electrical resistivity in a semiconductor device according to the present invention.

FIG. 19 shows the effect upon device $R_{dson}$ of increasing the metal thickness. Note that models of copper under just the source pads and all over the die were investigated. For example, with zero copper thickness and 4 μm aluminum the device $R_{dson}$ is approx 1.9 mOhm. As the thickness of copper is increased to 20 μm the $R_{dson}$ drops to 1.67 mOhm. This represents a reduction of over 200 μOhm.

Also models were developed to examine the effect of adding thick copper as the die size is reduced, keeping the die resistivity the same as the larger die. In both cases it appears possible to reduce $R_{dson}$ by over 0.5 mOhm by adding about 20 μm of copper.

Interestingly, the absolute reduction in $R_{dson}$ by adding thick copper appeared more significant in the smaller die sizes. It is believed that this result is due to the aspect ratio of the source areas being higher in smaller die, resulting in higher initial top metal resistance.

Thus, through experiments and models the inventors have discovered that a die having a thick copper body formed on a power electrode thereof exhibits a significantly reduced resistance. In both cases, for example, the addition of 1 to 20 μm of copper has shown reductions in $R_{dson}$ in the range of 180 to 200 μOhm. Furthermore models predict that similar, if not greater, absolute shifts in Rdson are possible with smaller die, and some models predict significant reductions in Rdson are possible by combining thick copper with thinned die. It is expected, therefore, that a semiconductor device according to the present invention when assembled in a DirectFET or a conventional package such as a TO-220 package will reduce the overall resistance of the package.

To examine the effect of area coverage on the resistivity of the device, a test mask was designed with three different die test patterns. FIGS. 20A-20C show the dimensions of the test patterns. The design rules used on each pattern are listed below.

Figure 21:
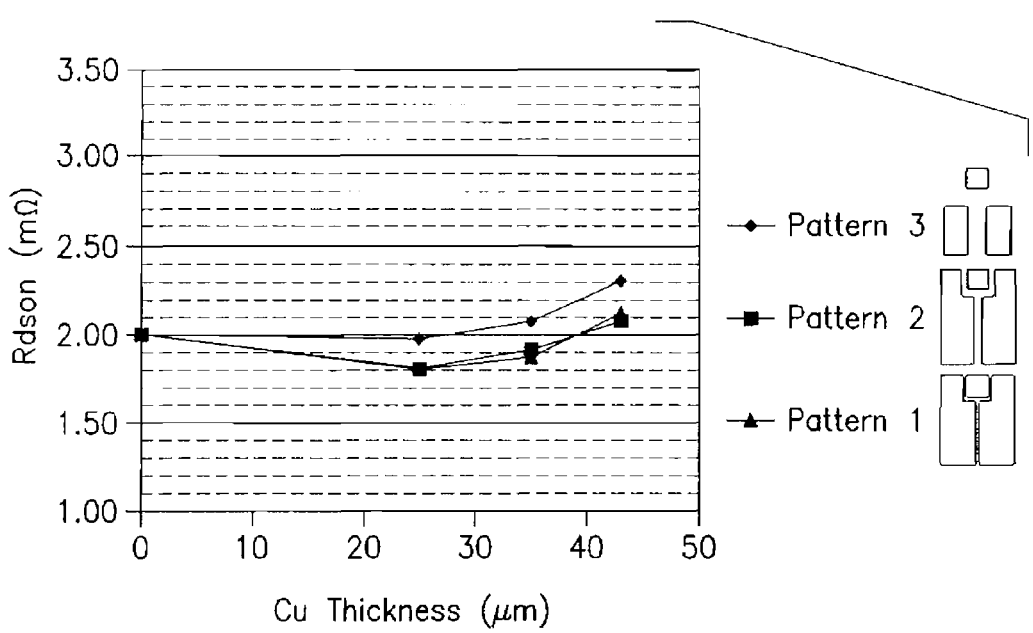
FIG. 21 graphically illustrates the effect of a pattern of the conductive body on the lowering of electrical resistivity.

Pattern 1 (full surface coverage) (FIG. 20A);
Min 220 µm clearance,
Min 50 µm clearance to nearest Al feature,
Area of feature on source: 2×4.34 mm$^2$,
Area of feature on gate: 0.77 mm$^2$,
Pattern 2 (reduced coverage) (FIG. 20B):
Min 300 µm clearance,
Min 50 µm clearance to the nearest Al feature,
Area of feature on source: 2×3.80 mm$^2$
Area of feature on gate: 0.77 mm$^2$
Pattern 3 (copper under source pads only) (FIG. 20C):
identical to Passivation opening,
Area of feature on source: 2×1.79 mm$^2$
Area of feature on gate: 0.71 mm$^2$ FIG. 21 illustrates the effect that a pattern may have on the resistivity of the device. As seen copper patterns 1 and 2 (FIGS. 20A and 20B), which cover respectively, all of and a substantial part of the area of the power electrode contribute the most to the reduction of the resistivity of the device.

Plating copper is advantageous in that it may be applied to selective regions of the die, may be applied during the die fabrication process or even during the packaging. Plating is commonly used in the circuit board industry and advantageously is a low temperature process. Plated copper also has the benefit of having electrical resistivity very close to that of pure copper.

In the preferred embodiment copper is plated using electroplating. Electroplating is advantageous specially when a copper thickness of more than a few microns is required in a relatively reasonable time in that electroplating offers relatively fast deposition rates.

Copper may also be plated using electroless plating if time is not an issue.

Other methods can also be used for forming a conductive body on an electrode of the device according to the present invention.

For example, thick film screen-printing is a low cost method available for forming a thick copper layer on an electrode of a power device. However, the processing temperatures for thick screen printing is relatively high (e.g. 500° C.+), and may in some cases cause wafer warpage (depending on the wafer). Nevertheless, such a process can be used to practice the present invention. Low temperature pastes may be used to overcome the problems associated with the high temperatures as long as the paste that is used is of lower resistance.

In addition, lamination techniques may be used for forming thick copper layers. Lamination based techniques of applying thick copper are commonly used in the circuit board industry. While copper or resin films can be applied to wafers using a lamination technique, making electrical connection between the film and the electrodes is likely to require laser or conventional drilling, plating and possibly via filling. Thus, lamination may be more expensive than plating the wafer surface, but can be used to practice the present invention.

In summary, for the reasons stated above, electroplating is preferred over other methods, although other methods are considered to be within the scope and the spirit of the present invention.

Figure 22A:
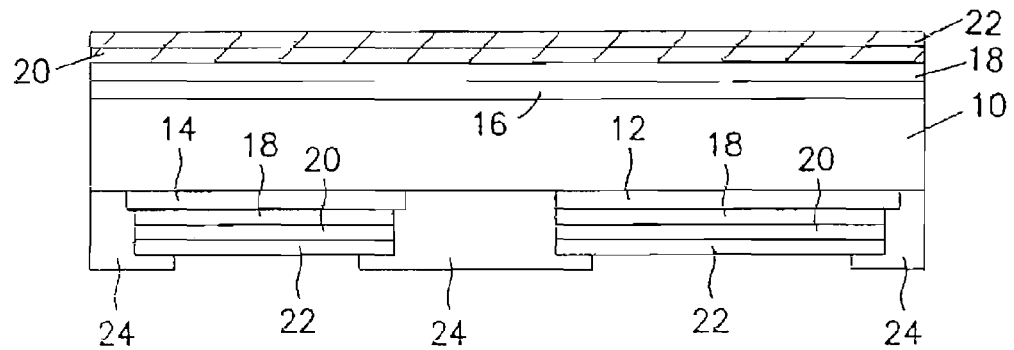
FIG. 22A illustrates a cross-sectional view of a semiconductor device according to an embodiment of the present invention.

Referring to FIG. 22A, in which like numerals identify like features, a semiconductor device according to the present invention includes a barrier layer 18 over second power electrode 16, a copper body 20 over barrier layer 18. Barrier layer 18 serves to protect second power electrode from contamination due to diffusion of copper. A device according to the preferred embodiment of the present invention includes a solderable body 22 formed over copper body 20.

The stack of barrier layer 18, and copper body 20 can be formed according to the process set forth above. In the preferred process, after deposition of copper seed layer 108 on barrier layer 18 on electrodes 12, 14, 16, the wafer is subject to electroplating so that copper bodies are grown over the front electrodes 12, 14 and the back electrode 16 at the same time.

Figure 22B:
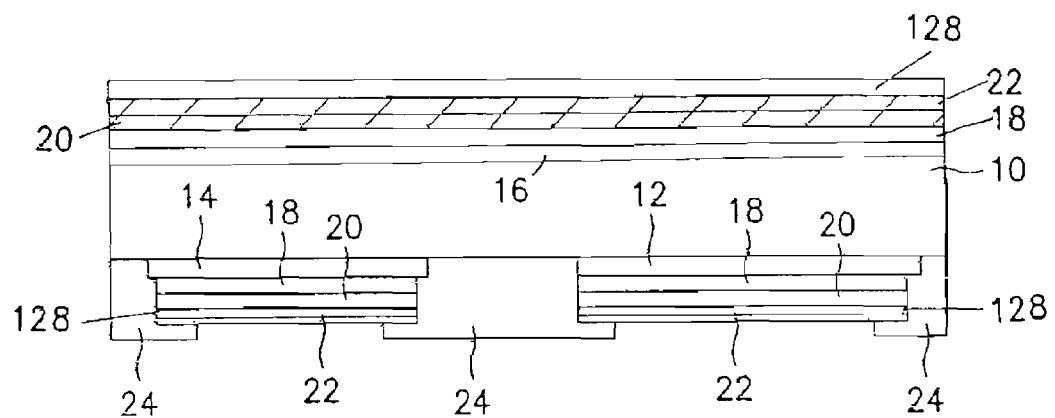
FIG. 22B illustrates a cross-sectional view of a semiconductor device according to an alternative embodiment of the present invention.

Referring now to FIG. 22B, in which like numerals identify like features, in another embodiment of the present invention, stress balancing bodies 128 are farmed over copper body 20 in order to even out the stress on die 10. Specifically, a stress balancing body 128 is formed on each side of the die to even out the stress. A suitable material for forming a stress balancing body 128 is nickel. Thus, the application of the nickel on both sides of die 10 counterbalances the stress created on the active side of the device.

Applying thick metallization to both sides of die 10 evens out the stress between front and backside metallization on die 10. Ideally equal areas and thickness of nickel should be applied on the front and rear side of die 10. For example, with reference to FIG. 22B on the total area of the front side copper 20 should equal the area of copper 20 on the rear of the die.

Note that the copper and solderable layers may be applied to the front and back side of die 10 simultaneously using the steps described for the front side metallization.

According to one aspect of the present invention, die 10 is reduced in thickness to further reduce the resistance thereof. Thus, die 10 may be reduced in thickness to 100 µm or less.

Figure 23:
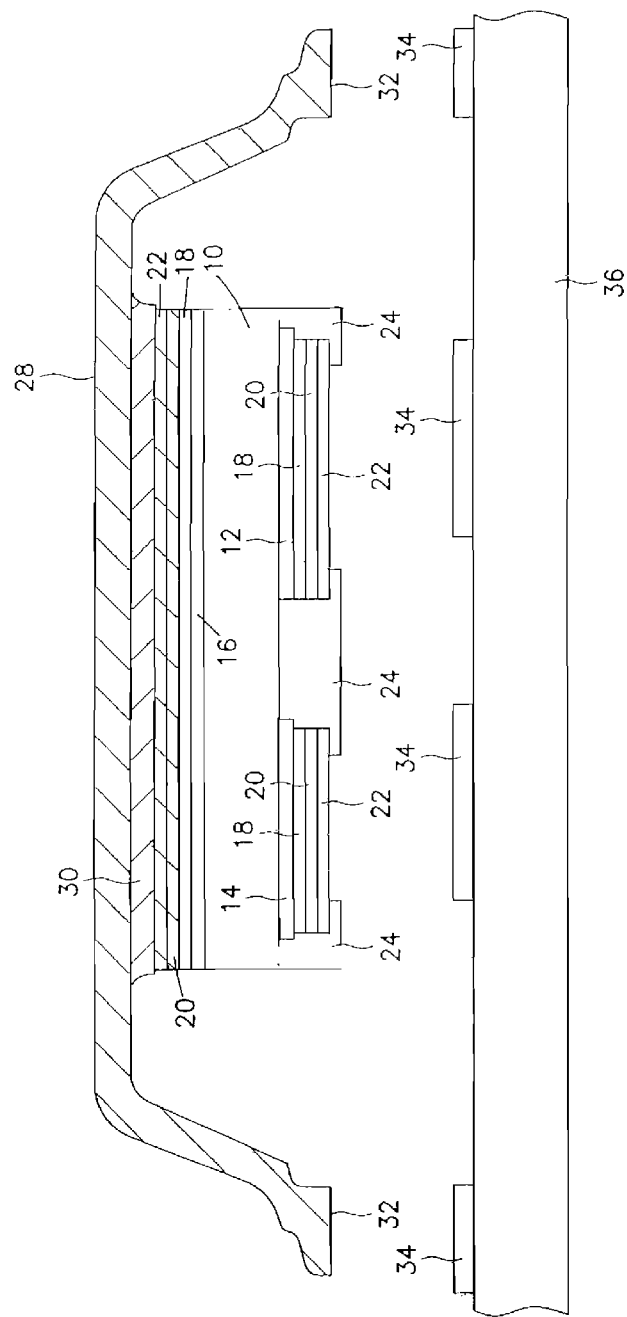
FIG. 23 illustrates a cross-sectional view of a package containing a semiconductor device according to the present invention.

Referring now to FIG. 23, in which like numerals identify like features, a semiconductor device according to the present invention can be disposed in a conductive can 28 as described above with reference to FIG. 8. Alternatively, a semiconductor device according to FIG. 22B may be used in combination with a can 28 in the manner described above with reference to FIG. 8.

Figure 24A:
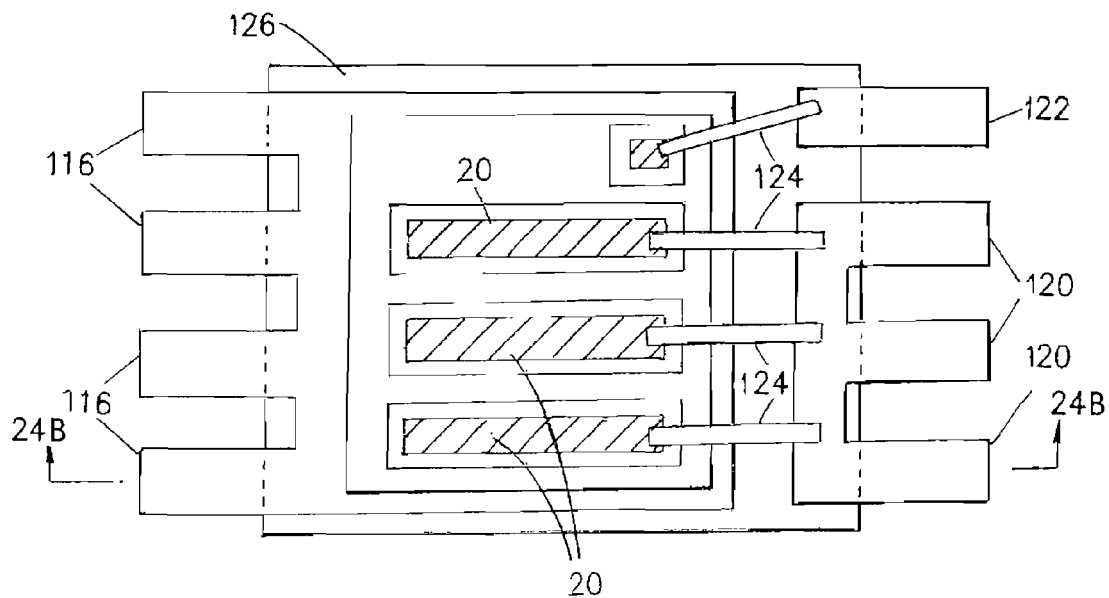
FIG. 24A illustrates a top plan view of a semiconductor device disposed in an alternative package.
Figure 24B:
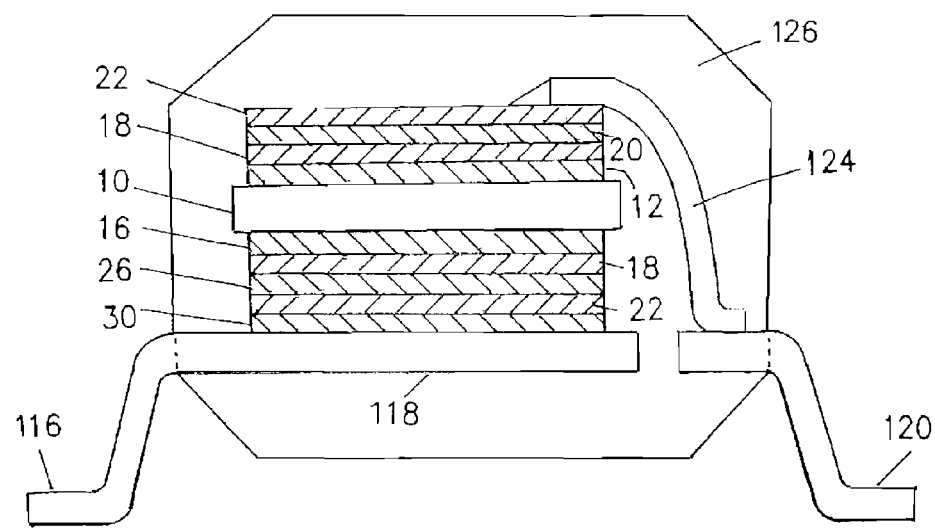
FIG. 24B illustrates a cross-sectional view of the package of FIG. 24A along line 24B-24B, viewed in the direction of the arrows.

Referring now to FIGS. 24A-24B, a semiconductor device according to the present invention may be packaged in a conventional package, such as SO-8. Such a package may include a drain lead 116, which is integrated with a drain pad 118, a source lead 120, and a gate lead 122. Drain pad 118 is electrically and mechanically coupled to copper body 20 that is over drain electrode 16 using a conductive adhesive 30 such as solder, or a conductive epoxy. Wire bond 124 can be used to connect source lead 120 to copper body 20 over source electrode 12, and copper body 20 over gate electrode 14. Mold compound 126 can be molded over at least the semiconductor device to form a housing (rendered transparent in FIGS. 24A, 24B for better illustration) for the package as is well known.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor body including a first surface and a second surface, said semiconductor body comprising a first power electrode on said first surface of said semiconductor body, and a second power electrode on said second surface of said semiconductor body;
   a first barrier layer over said first power electrode;
   a second barrier layer over said second power electrode;

a first metallic body having a resistivity less than a resistivity of said first power electrode formed over said first barrier layer;

a second metallic body having a resistivity less than a resistivity of said second power electrode formed over said second barrier layer;

wherein said first metallic body is configured for flip-chip mounting over said first surface and said second metallic body is configured for flip-chip mounting over said second surface.

2. The semiconductor device of claim 1, wherein said first and second power electrodes comprise aluminum.

3. The semiconductor device of claim 1, wherein said first and second power electrodes comprise AlSi.

4. The semiconductor device of claim 1, wherein said first and second power electrodes comprise AlSiCu.

5. The semiconductor device of claim 1, wherein said first and second barrier layers comprise titanium.

6. The semiconductor device of claim 1, wherein said first and said second metallic bodies comprise copper.

7. The semiconductor device of claim 1, further comprising a nickel layer over at least one of said first and second metallic bodies.

8. The semiconductor device of claim 1, further comprising a stress balancing body disposed on at least one of said first and second metallic bodies.

9. The semiconductor device of claim 1, wherein said semiconductor device is a power MOSFET, and said first and said second power electrodes are, respectively, a source electrode and a drain electrode.

10. The semiconductor device of claim 1, further comprising a control electrode, a third barrier layer over said control electrode, and a third metallic body having a resistivity less than a resistivity of said control electrode formed over said third barrier layer.

11. The semiconductor device of claim 1, further comprising a solderable body over said first metallic body.

12. The semiconductor device of claim 11, wherein said solderable body comprises a nickel layer.

13. The semiconductor device of claim 11, wherein said solderable body comprises NiAg.

14. The semiconductor device of claim 11, wherein said solderable body comprises NiAu.

15. The semiconductor device of claim 1, further comprising a solderable body over said second metallic body.

16. The semiconductor device of claim 15, wherein said solderable body comprises a nickel layer.

17. The semiconductor device of claim 15, wherein said solderable body comprises NiAg.

18. The semiconductor device of claim 15, wherein said solderable body comprises NiAu.

19. The semiconductor device of claim 1, wherein said first barrier layer prevents contamination of said first power electrode by said first metallic body.

20. The semiconductor device of claim 1, wherein said second barrier layer prevents contamination of said second power electrode by said second metallic body.

* * * * *